(12) United States Patent
Livni (10) Patent No.: US 6,427,466 B1
(45) Date of Patent: Aug. 6, 2002

(54) FORCED CONVECTION COOLING SYSTEM FOR ELECTRONIC EQUIPMENT

(75) Inventor: Avinoam Livni, Haifa (IL)

(73) Assignee: Celletra LTD, Ilit (IL)

( * ) Notice: Subject to any disclaimer, the term of this patent is extended or adjusted under 35 U.S.C. 154(b) by 0 days.

(21) Appl. No.: 09/733,957

(22) Filed: Dec. 12, 2000

(51) Int. Cl.[7] .............................................. F25D 23/12
(52) U.S. Cl. ........................ 62/259.2; 62/407; 62/419; 62/361; 62/692; 62/691
(58) Field of Search .......................... 62/407, 419, 361, 62/692, 691, 259.2

(56) References Cited

U.S. PATENT DOCUMENTS

| | | | |
|---|---|---|---|
| 3,559,728 A | * | 2/1971 | Lyman ........................ 165/55 |
| 4,399,484 A | | 8/1983 | Mayer |
| 4,962,444 A | | 10/1990 | Niggemann |
| 5,067,047 A | | 11/1991 | Azar |
| 5,428,503 A | | 6/1995 | Matsushima et al. |
| 5,823,248 A | * | 10/1998 | Kadata et al. .......... 165/104.33 |
| 6,127,663 A | * | 10/2000 | Jones .......................... 219/553 |
| 6,219,258 B1 | * | 4/2001 | Denzene et al. ............. 361/816 |
| 2001/0004316 A1 | * | 6/2001 | Denzene et al. ............. 361/816 |

* cited by examiner

*Primary Examiner*—William C. Doerrler
*Assistant Examiner*—Mark Shulman
(74) *Attorney, Agent, or Firm*—Pillsbury Winthrop LLP (57) ABSTRACT

A cooling system for telecommunication equipment including a heat exchanger having outwardly protruding, parallel fins to dissipate heat. Each pair of fins forming an elongated channel. The system includes an ejector positioned within each channel to direct pressurized air through the channels while dragging ambient air through the channels along with the pressurized air. The pressurized and ambient air passing through the channels increases the ability of the fins to dissipate heat. Since the source of pressurized air can be remote from the telecommunications equipment in a protected and easily accessed location, the ejectors provide a rugged cooling mechanism adjacent the heat exchanger with no moving parts.

10 Claims, 11 Drawing Sheets

| | CHANNEL | | | | | | | | | | | | | | | FEED PRESSURE |
|---|---|---|---|---|---|---|---|---|---|---|---|---|---|---|---|---|
| | 15 | 14 | 13 | 12 | 11 | 10 | 9 | 8 | 7 | 6 | 5 | 4 | 3 | 2 | 1 | |
| W/O COVER | 1.8 | 1.6 | 1.3 | 2 | 2 | 2.4 | 1.1 | 1.7 | 2 | 2 | 1.5 | 1.3 | 1.4 | 2 | 1.8 | 3 BAR |
| | 2.4 | 2 | 2.2 | 1.9 | 2.3 | 2.8 | 1.3 | 1.9 | 2.4 | 2.3 | 1.6 | 1.3 | 1.3 | 2.5 | 2.2 | 3.5 BAR |
| WITH COVER | 1.7 | 1.9 | 2.1 | 1.8 | 2.1 | 2.6 | 1.2 | 2.2 | 2.1 | 2.2 | 1.4 | 2 | 1.6 | 2.1 | 1.9 | 3 BAR |
| | 1.8 | 2.1 | 2.3 | 2 | 2.3 | 3.1 | 1.4 | 2.5 | 2.4 | 2.4 | 1.6 | 2.3 | 1.8 | 2.4 | 2.2 | 3.5 BAR |

FORCED CONVECTION COOLING SYSTEM FOR ELECTRONIC EQUIPMENT

BACKGROUND

1. Field of the Invention

The present invention, in certain respects, relates to cooling electronic equipment. In other respects, the present invention relates to cooling telecommunication equipment in harsh environments.

2. Description of Background Information

There is an ongoing need to cool high power electronic equipment efficiently and reliably. This is especially true with cellular communication base station antennas. These antennas are generally mounted atop high towers or masts in order to effectively transmit and receive signals. The environment in which these antennas are positioned is often hostile due to high temperatures, dust and other particles in the air, as well as to birds and insects. Therefore, previous attempts to cool such antennas have been ineffective. Atop towers and masts, use of conventional fans and blowers have limited life expectancy and are difficult to service. Natural convection heat exchangers are also deficient due to their excessive size and weight, which results in decreased efficiency. A harsh environment further decreases the efficiency of natural convention heat exchangers.

Thus, there is a need for an efficient cooling system that is impervious to environmental conditions.

SUMMARY OF THE INVENTION

The present invention is provided to improve cooling systems and cooling methods for electrical systems. More specifically, improved systems and methods are presented to provide a cooling system for electrical equipment of active cellular communication base station antennas that is efficient and that can be employed in hostile environmental conditions.

A cooling system of the invention can include a finned, heat exchanger connected to a base station antenna atop a tower or pole. Air nozzles can be positioned in between pairs of fins and pressurized air forced through the nozzles blows between the pairs of fins to cool the fins. Ambient air surrounding the fins and nozzles can be dragged along with the pressurized air to further aid in cooling the fins. The pressurized air can be supplied to the nozzles from a remote source off the tower or pole so that the air source can be easily accessed or repaired.

BRIEF DESCRIPTION OF THE DRAWINGS

The present invention is further described in the detailed description which follows, by reference to the noted drawings by way of non-limiting exemplary embodiments, in which like reference numerals represent similar parts throughout the several views of the drawings, and wherein.

DETAILED DESCRIPTION OF THE INVENTION

Figure 1:
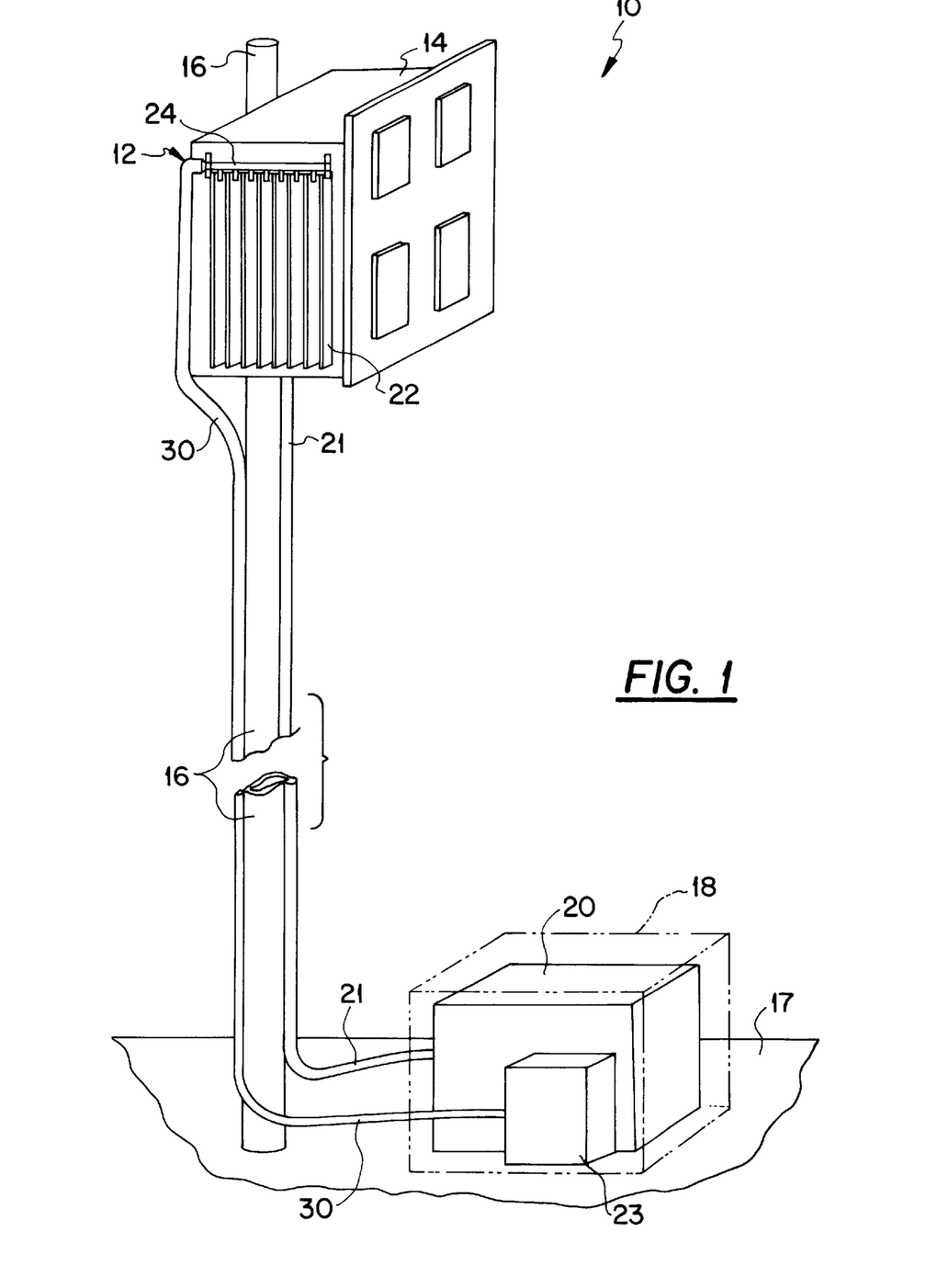
FIG. 1 is a perspective view of a cellular communication base station antenna system illustrating a cooling system of the present invention.

The cooling system of the invention is applicable to a variety of systems needing to more efficiently dissipate heat. The cooling system of the invention is particularly useful with systems having a heat dissipating element positioned in an environment that is not environmentally suited rotating fans or that is not easily accessible. FIG. 1 illustrates a particular embodiment of the invention where the elements dissipating heat are both in hostile environmental conditions and not easily accessible. That is, FIG. 1 generally illustrates an active cellular communication base station antenna system 10 utilizing a cooling system 12 of the present invention. Since the cooling system 12 has no moving parts at the remote location of the antenna subsystem 14, a more efficient and durable cooling system is achieved for the antenna system 10.

The base station antenna system 10 includes an antenna subsystem 14 mounted in a raised fashion on a support structure 16. Control equipment 20 for the antenna subsystem 14 is preferably positioned remote from the support structure 16, for example, on a base 17. The cooling system 12 can include a finned heat exchanger 22 connected to the antenna subsystem 14 for dissipating heat generated by the antenna subsystem 14, an ejector assembly 24 having nozzles or ejectors 26 positioned between each pair of fins, and an air compressing mechanism 23 that can be located remote from the ejectors 26 and the antenna subsystem, for example, on base 17.

The antenna subsystem 14 can be of any type and is illustrated as being mounted on a support structure such as mast 16 as illustrated in FIG. 1. Of course, antenna subsystem 14 can be mounted on any appropriate support structure that raises the antenna to its appropriate height. This may include a truss structure and can include support structures 16 mounted on the ground or on another structure, such as a building. Control equipment 20 for the base station antenna system 10 can be positioned as appropriate and is preferably positioned remote from the support structure 16 and on base 17. The control equipment 20 for the base station antenna system 10 can be operatively connected to the antenna subsystem 14 in a usual manner, such as via a series of cables 21.

The heat exchanger 22 is conductively connected to one or more electrical or heat producing components of the antenna subsystem 14. As such, heat generated by the antenna subsystem 14 is drawn therefrom into the heat exchanger 22, by heat conduction. The heat exchanger 22 can be formed of a highly heat conductive material to aid in the heat conduction process. Heat generated by the electrical components of the antenna subsystem 14 flows through the conductive connectors into the heat exchanger 22.

Figure 2:
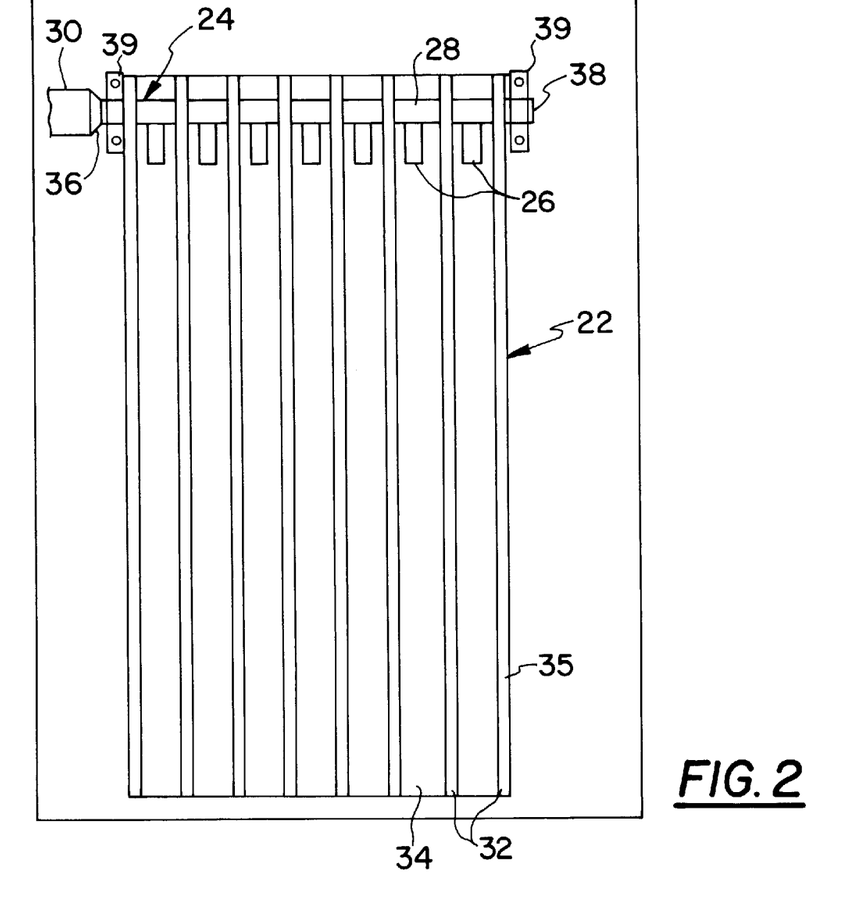
FIG. 2 is a front view of a portion of the cooling system illustrated in FIG. 1.
Figure 3:
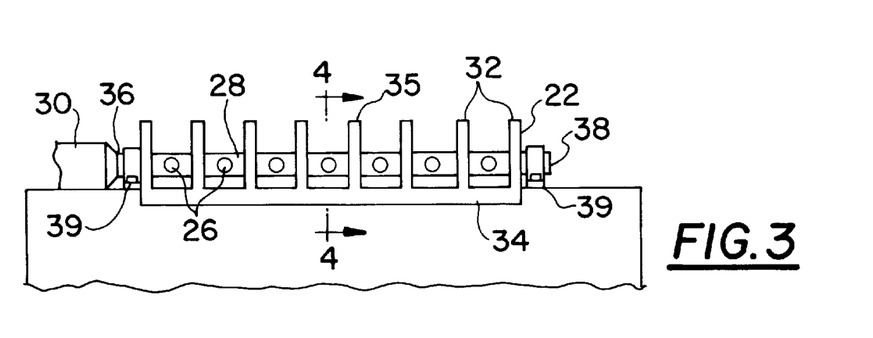
FIG. 3 is a bottom view of the cooling system illustrated in FIG. 2.

As shown in FIGS. 2 and 3, the heat exchanger 22 can be equipped with a series of spaced, heat dissipating fins 32 that extend outwardly from a body portion 34 of the heat exchanger. The fins 32 increase the area of an exterior surface 35 of the heat exchanger 22 and therefore increase the heat exchanging capacity of the heat exchanger 22. Heat flowing into the heat exchanger 22 from the antenna subsystem 14 is liberated from the exterior surface 35 into the atmosphere through heat convection. The fins 32 can be formed in various configurations depending on the desired heat exchanging properties. For example, the fins 32 can be substantially flat or can be corrugated.

Natural convection from ambient airflow dissipates heat from the heat exchanger 22 and provides a flow of cooling medium such as atmospheric air across the exterior surface 35 of the heat exchanger 22. An increase in the area of the exterior surface 35, such as by adding fins 32, corresponds to an increase in heat dissipation possible by the heat exchanger 22.

As illustrated in FIGS. 1 and 2, the ejector assembly 24 has a series of ejectors or nozzles 26 that can be connected to a manifold structure 28. The manifold structure 28 can be, in turn, connected to a conduit 30 that extends from the compressing mechanism 23 so that air can be supplied to the manifold 28 by conduit 30.

Although the manifold structure 28 can take numerous forms, one form is illustrated in FIGS. 2 and 3. The illustrated manifold structure 28 can extend along the heat exchanger 22 transverse to the fins 32 while extending through the fins 32 and can include a series of ejectors 26 connected thereto. The manifold structure can be connected to the conduit 30 on one end 36, while being sealed on an opposite end 38. As such, pressurized air from the compressor 23 can enter the manifold structure 28 at the end 36 thereof and can exit through each of the ejectors 26. The manifold structure 28 can be a tubular member with a series of spaced openings for attachment to ejectors 26, which correspond to the cavities between each pair of fins 32. The manifold structure 28 can be formed of any suitable material. Preferably, manifold 28 is formed from a non-corrosive material such as stainless steel or plastics. As illustrated in FIG. 1, the manifold structure 28 may be mounted to a portion of the antenna subsystem 14, for example with a pair of connecting members 39 (see also FIG. 2), such that the ejectors 26 are disposed between corresponding fins 32 of the heat exchanger 22. The manifold 28 may be mounted on the bottom side of the finned heat exchanger, thus using the natural convection flow effect of upwardly increasing temperature.

Figure 4:
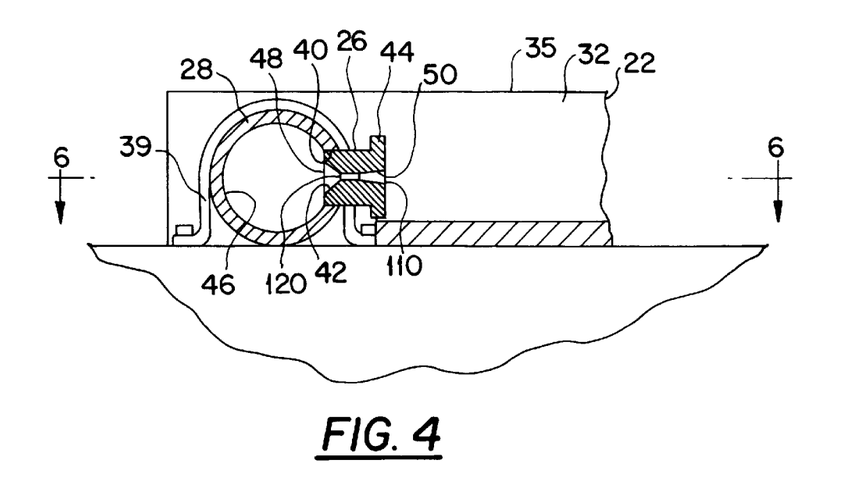
FIG. 4 is a sectional view of the cooling system taken along line 4—4 in FIG. 3.

As illustrated in FIG. 4, an ejector 26 can be secured within a corresponding opening 40 within the manifold structure 28 in any appropriate manner. For example, the ejectors 26 may be securely press-fit within the corresponding openings 40, or that they may be welded in position. Also, it may be advantageous for the ejectors 26 to be removably connected to the manifold structure 28, such as by a threaded connection, as illustrated.

As further shown in FIG. 4, each of the ejectors 26 has a central opening 42 that extends longitudinally though an ejector body 44. One (entry) end 48 of the central opening 42 is communicated with an air pathway 46 of the manifold structure 28, while an opposite (exit) end 50 of the central opening 42 communicates with the atmosphere. The central opening 42 may be configured with a venturi shape, as shown in FIG. 4 to increase the velocity of air flowing therethrough. Although the dimensions of the nozzle can vary depending upon the desired performance and size characteristics, the entry end 48 can exhibit an approximately 120 degree converging funnel shape and the central opening 42 can exhibit an approximately 10–20 degree diverging funnel shape. Also, the exit diameter 110 of the nozzle is preferably approximately 1.5 times larger than the restrictor diameter 120, as seen in FIG. 4.

Figure 16:
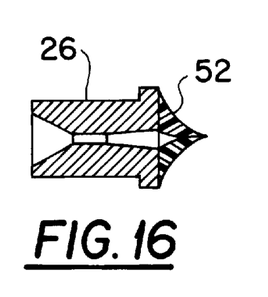
FIG. 16 is a longitudinal cross-sectional view of the nozzle of the invention similar to FIG. 4, but illustrating a cover in a closed position mounted on the nozzle, with no air flowing through the nozzle.
Figure 17:
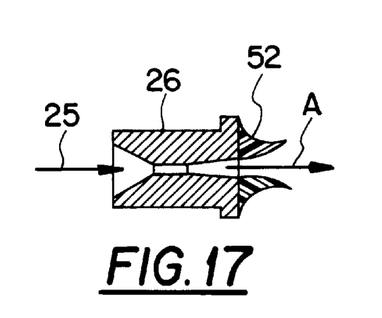
FIG. 17 is a cross-sectional view similar to FIG. 16, but illustrating the cover in an open position with air flowing through the nozzle.

It may be advantageous for each ejector 26 to include a polymer cover to protect the exit end 50 of the central opening 42. One preferred design is a "duckbill" elastomeric cover 52 which remains closed as seen in FIG. 16 when no air passes through nozzle 26 and then, as seen in FIG. 17, cover 52 opens when air is forced through nozzle 26. Thus, the cover 52 can keep unwanted debris from entering nozzle 26 and keeps the nozzle 26 free from clogging.

Figure 15:
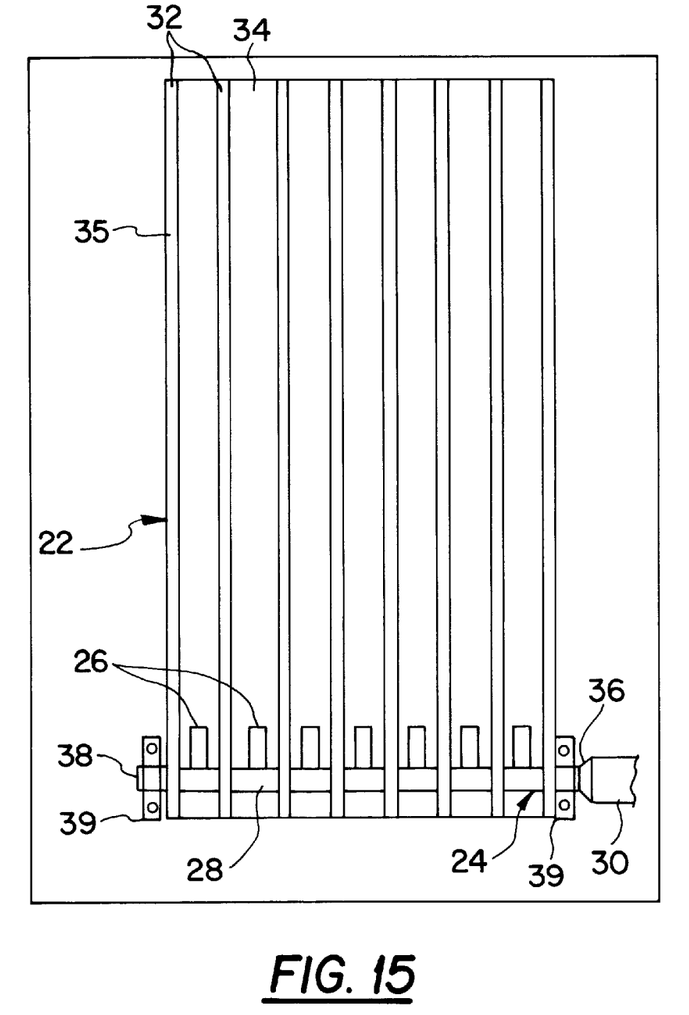
FIG. 15 is similar to FIG. 2 but illustrates the nozzles and manifold at the bottom of the heat exchanger.

As shown in FIG. 1, it may be preferable for the heat exchanger 22 and the ejector assembly 24 to be mounted on the antenna subsystem 14 such that the ejectors 26 point generally downwardly. In this manner, the central openings 42 of the ejectors 26 may be less prone to contamination and/or damage than in an upwardly pointing configuration. On the other hand, as seen in FIG. 15, upwardly pointing nozzles are thermally more effective, as the flow increases by natural convection effects.

It is noted that the cooling system of the present invention can be made generally impervious to environmental conditions by enclosing all of the mechanical mechanisms such as an air compressor 23 within an enclosure 18, as shown in FIG. 1. It is noted that the compressing mechanism 23 may require relatively little maintenance, since it can be disposed within the enclosure 18 and is not exposed to severe environmental conditions. Furthermore, the conduit 30 may be formed of any appropriate material such as weather resistant hose or pipe to avoid degradation of the conduit 30, for example, a suitable medium-pressure polymer hose or non-corrosive pipe could be employed. The other structures such as the manifold structure 28 and the ejectors 26 may also be formed of non-corrosive materials to avoid degradation. In a case where the compressing mechanism 23 requires servicing, the compressing structure 23 is readily accessible and serviceable.

Figure 5:
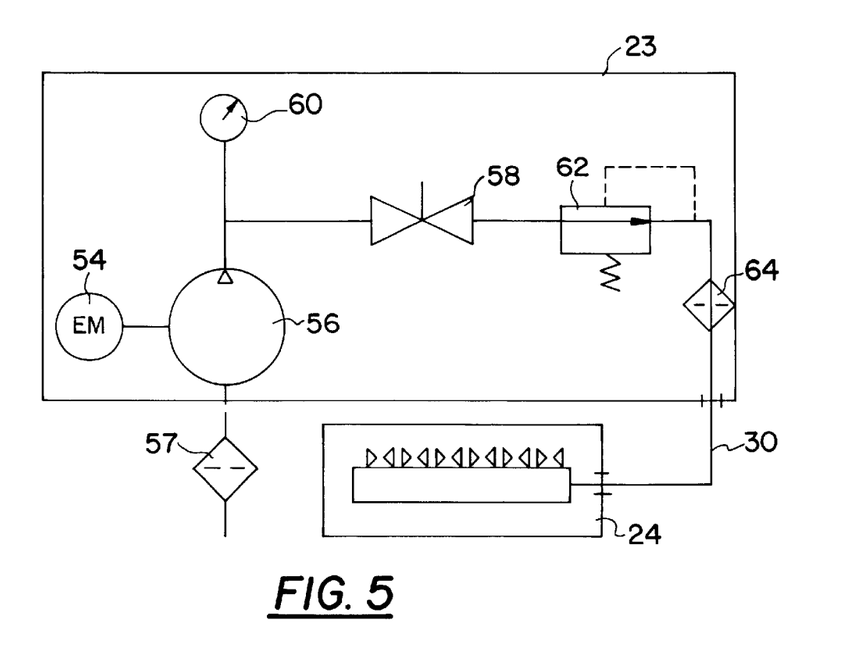
FIG. 5 is a schematic view of the pneumatic system of the cooling system illustrated in FIG. 1.

The general operation of the cooling system of the present invention is as follows. FIG. 5 shows a schematic diagram representing the cooling system 12 of the present invention. As shown, the compressing mechanism 23 preferably includes an electric motor 54, which is operatively coupled to a pneumatic compressing structure 56. The pneumatic compressing structure 56 compresses air from the atmosphere through a serviceable inlet filter 57 and produces a flow of compressed air. The compressing structure 56 is connected to a valve 58, which allows the compressing structure 56 to be isolated and the flow of compressed air to be redirected, preferably into the atmosphere, so that the various components of the cooling system 12 may be serviced. A gauge 60 is communicated with the air flow between the compressing structure 56 and the valve 58 to monitor the pressure of the air therein. A pressure reducing valve 62 maintains the air flow to the ejector assembly 24 at a constant pressure. It may also be advantageous to include a micronic filter 64, which screens particles from the air flow in order to prevent clogging of the central openings 42 of the ejectors 26. The air flow is then communicated to the ejector assembly 24 via the conduit 30.

Figure 6:
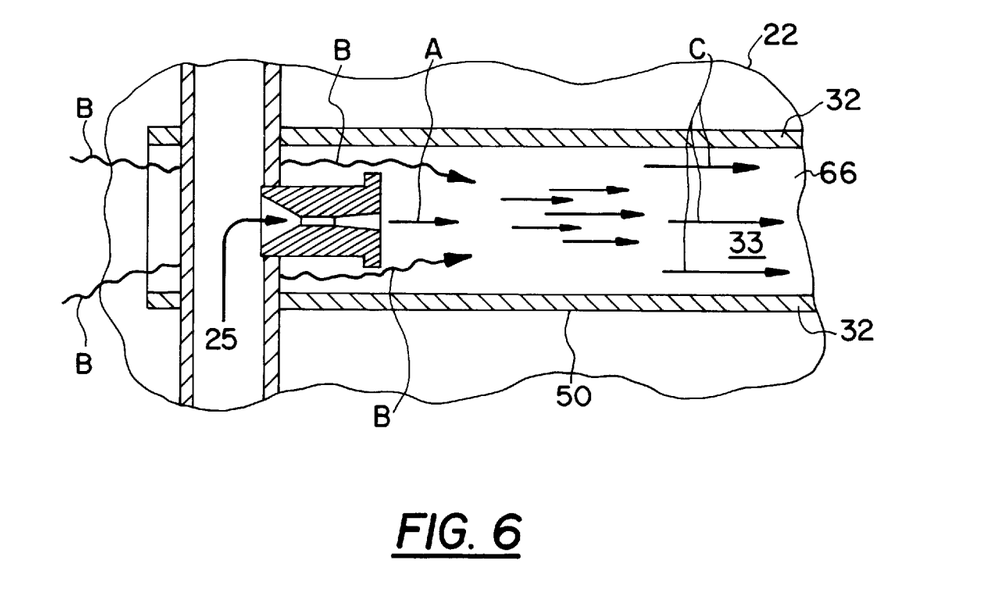
FIG. 6 is a cross-sectional view of the cooling system taken along line 6—6 in FIG. 4.

Referring to FIG. 6, the compressing mechanism 23 produces a compressed fluid such as compressed air 25, which is directed to the ejectors 26. The ejectors 26 then emit and direct a pressurized stream of air (indicated at A in FIG. 6) between the corresponding fins 32 of the heat exchanger 22. The stream of air A then flows generally between the fins 32 and within a channel or cavity 66, cooperatively formed between adjacent fins 32 and a surface 33 of the body portion 34, along the length of the heat exchanger 22.

The venturi configuration of the central openings 42, as described previously, serves to increase the velocity of the pressurized air flowing through the ejectors 26. Therefore, upon exit from each ejector 26, the corresponding stream of air A has a relatively high velocity. It is preferred that the velocity will be as high as possible. Sonic or supersonic velocities give better cooling performance. It is noted that a velocity of the total air flow in between the fins of about 2 m/sec may be advantageous for inducing efficient forced convection. The high velocity air A exiting the ejector 26 "pulls" or "drags" the atmospheric air proximate the exit end 50 of the ejector 26 producing a pressure differential (i.e., a suction force toward the exit end 50). As such, air from the atmosphere is pulled (indicated at B in FIG. 6) into the stream of air (indicated at C in FIG. 6) exiting the ejector 26 and forced down the channel 66. Therefore, volumetric flow rate of air traveling across the exterior surface 35 of the heat exchanger 22 is increased, effectively increasing the heat dissipation capacity of the heat exchanger 22.

Various configurations are possible for the cooling system 1. For example, the shape and spacing of the fins 32 can be varied as well as the shape and specific dimensions of the ejectors 26 to obtain desired relationships and cooling characteristics for the desired implementation of the cooling system. Additionally, the manner of providing compressed air or other fluid to ejectors 26 can take various forms, such utilizing a single, integrally formed manifold 28.

There are various additional embodiments of the cooling system of the present invention that are possible. The embodiments shown and described herein are exemplary examples and are illustrated with respect to the illustrated system of FIGS. 1–6. Other embodiments are, of course, possible.

Figure 7A:
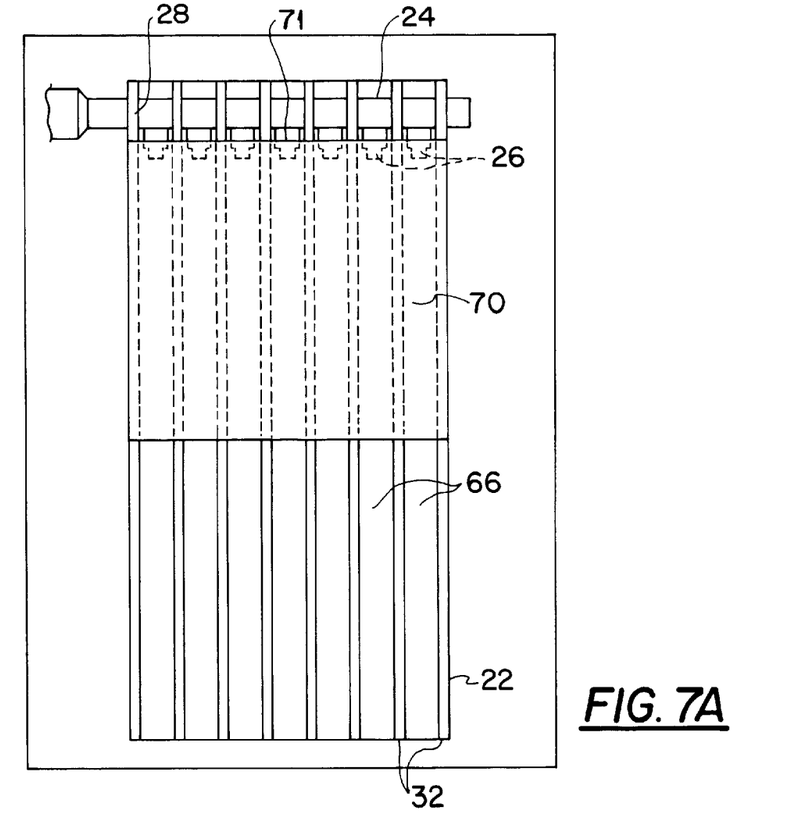
FIG. 7A is a front view of the cooling system similar to FIG. 2, but with a partial enclosure member installed thereon.
Figure 7B:
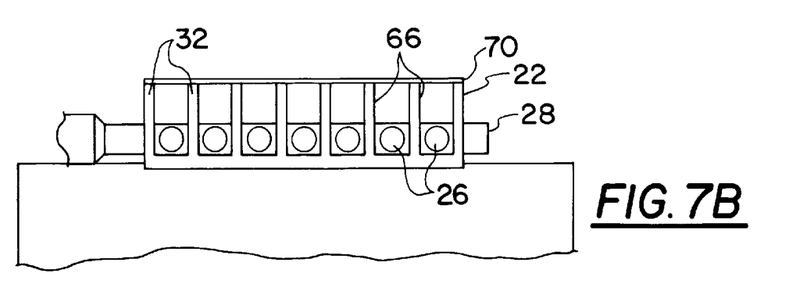
FIG. 7B is a bottom view of the cooling system illustrated in FIG. 7A with the partial enclosure member in place.

FIGS. 7A and 7B show a partial enclosure member 70 attached to the heat exchanger 22. The partial enclosure member 70 serves to overlay and enclose a portion of the channels 66 of the heat exchanger 22. The partial enclosure member 70 prevents the air stream from exiting the corresponding channels 66 prior to reaching the far end of each channel 66 to thereby maintain a high volumetric flow rate across the heat exchanger 22. Since the air stream is substantially prevented from dispersing into the atmosphere until the stream passes over a significant surface area of the heat exchanger 22, the efficiency of the cooling system 12 may be enhanced. Enclosure member 70 can be positioned at various positions with respect to the nozzles 26. For example, the enclosure member 70 can begin to cover the channels 66 at the nozzles 26 such that the edge 71 of the cover 70 is aligned with the nozzles 26 and is positioned over the nozzles 26, as illustrated in FIG. 7A. Alternatively, the beginning of the cover 70 can be positioned upstream or downstream of channel 66 with respect to each nozzle 26 to permit the desired amount of ambient air adjacent each nozzle 26 to be "dragged" into and through channel 66 by the air exiting from nozzle 26.

Figure 8A:
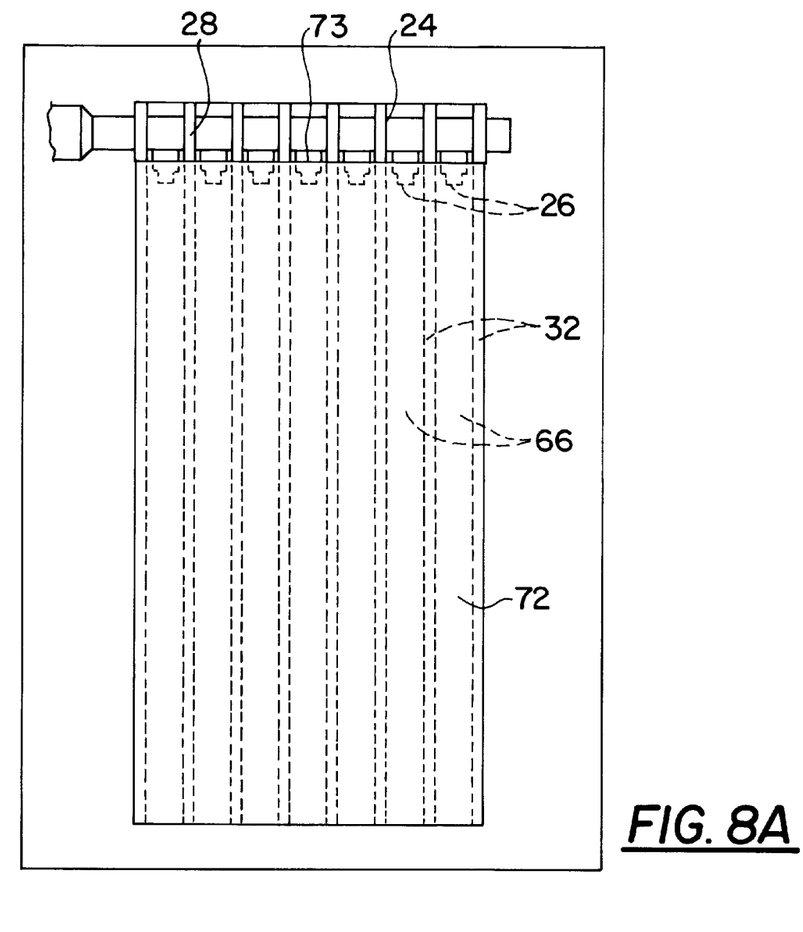
FIG. 8A is a front view of the cooling system similar to FIG. 2, but with a full enclosure member installed thereon.
Figure 8B:
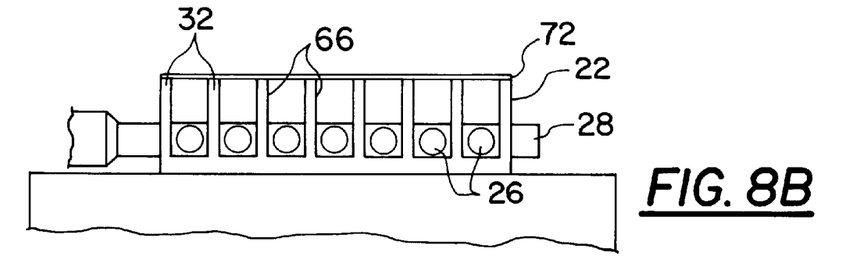
FIG. 8B is a bottom view of the cooling system illustrated in FIG. 8A with the full enclosure member in place.

FIGS. 8A and 8B show a full enclosure member 72 attached to the heat exchanger 22. Similar to the embodiment illustrated in FIGS. 7A and 7B, the air streams are directed over a significant surface area of the heat exchanger 22 to enhance the efficiency thereof. Member 72 has an edge 73 that is preferably positioned over the nozzles 26. With either of the embodiments shown in FIGS. 7A through 8B, it may be preferable for the enclosure members 70, 72 to be relatively unrestrictive to heat flow. In other words, it may be preferable for the enclosure members 70, 72 to be substantially impregnable to air flow, to maintain the air stream integrity, while allowing heat to readily dissipate therethrough to prevent heat build-up within the heat exchanger 22. It is contemplated that among the many options in forming the enclosure members 70 and 72, a relatively thin polymer sheet-like member may be utilized as the enclosure members 70, 72. It is also contemplated that a relatively thin sheet-like metallic member may also be utilized for the enclosure members 70, 72, this may be preferred due to the addition of heat dissipating surfaces.

Figure 9:
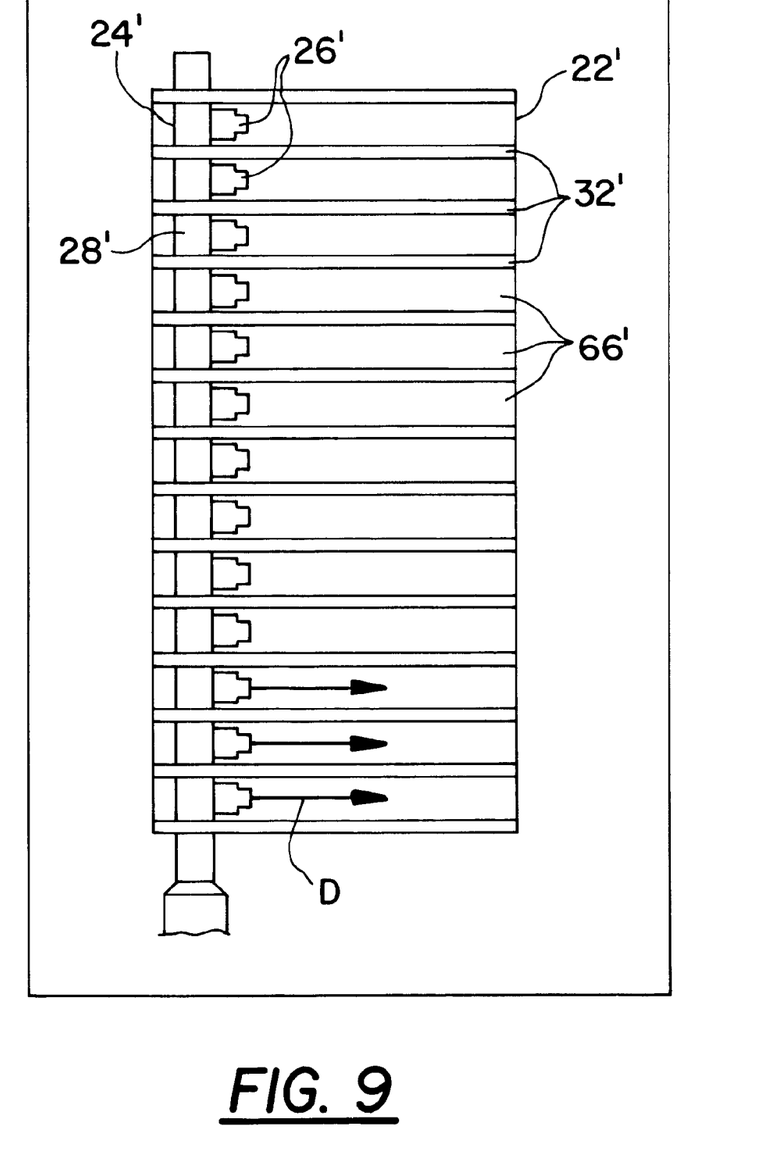
FIG. 9 is an alternate embodiment of the cooling system illustrating horizontally extending fins and nozzles.

FIG. 9 illustrates an additional embodiment of a heat exchanger 22' and ejector assembly 24' of the cooling system of the present invention. In this embodiment, the heat exchanger 22' includes a laterally extending, longitudinally spaced series of fins 32'. Additionally, for this embodiment, the manifold structure 28' may extend the length of the heat exchanger 22' and include a greater amount of ejectors 26' disposed within channels 66' of the heat exchanger 22'. As shown, the ejector assembly 24' utilizes a larger number of ejectors 26' as compared with the embodiment illustrated in FIGS. 1–8B. It is noted that a rate of air flow through each ejector 26' may be relatively lower than that through each ejector 26 since more ejectors 26' are used, however, as shown, the air streams (indicated at D in FIG. 9) have a relatively shorter distance to travel if the fins 32' are shorter and are directed along a width of the heat exchanger 22'. As such, an average flow rate across the heat exchanger 22' may be comparable to that across heat exchanger 22. This embodiment may have the advantage of producing lower temperature differences between air entering the channels 66 and the air exiting the channels 66 to ambient air, thus, keeping the heat exchanger at a more uniform temperature.

Figure 10:
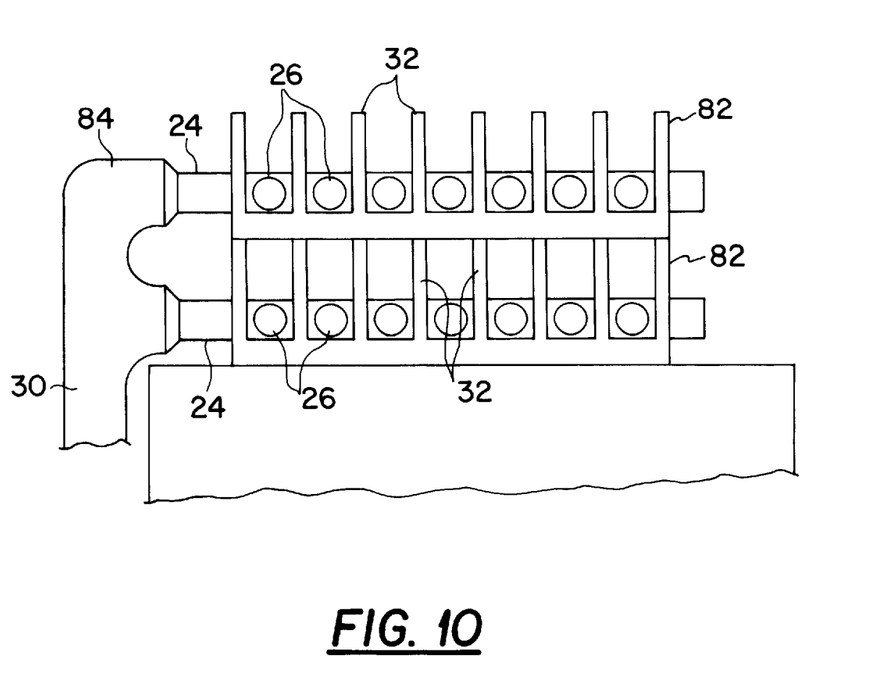
FIG. 10 is an alternate embodiment of the cooling system illustrating a pair of stacked heat exchangers.

FIG. 10 shows yet another embodiment of the invention in the form of a set of stacked heat exchangers 82. It is contemplated that two or more heat exchangers 82 may be utilized in this embodiment. As shown, this embodiment includes one ejector assembly 24 for each of the heat exchangers 82. The ejector assemblies 24 are interconnected at a connecting structure 84, which is connected to the conduit 30. This embodiment may be used to enhance the efficiency of the cooling system of the present invention, or may be used to cool separate components of the antenna subsystem 14.

The following includes a tested configuration of the cooling system of the invention along with observations and data from conducted tests. The tested configuration and resulting data is not meant to be limiting with respect to the scope of the present invention but illustrates specific performance characteristics associated with a specific configuration of an apparatus employing some of the principles of the invention.

Figure 11:
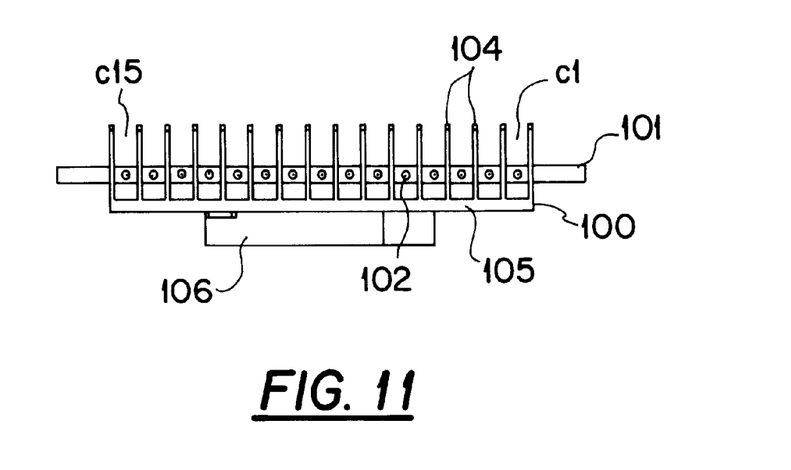
FIG. 11 is a bottom view of an embodiment of the cooling system for which testing was performed.
Figure 12:
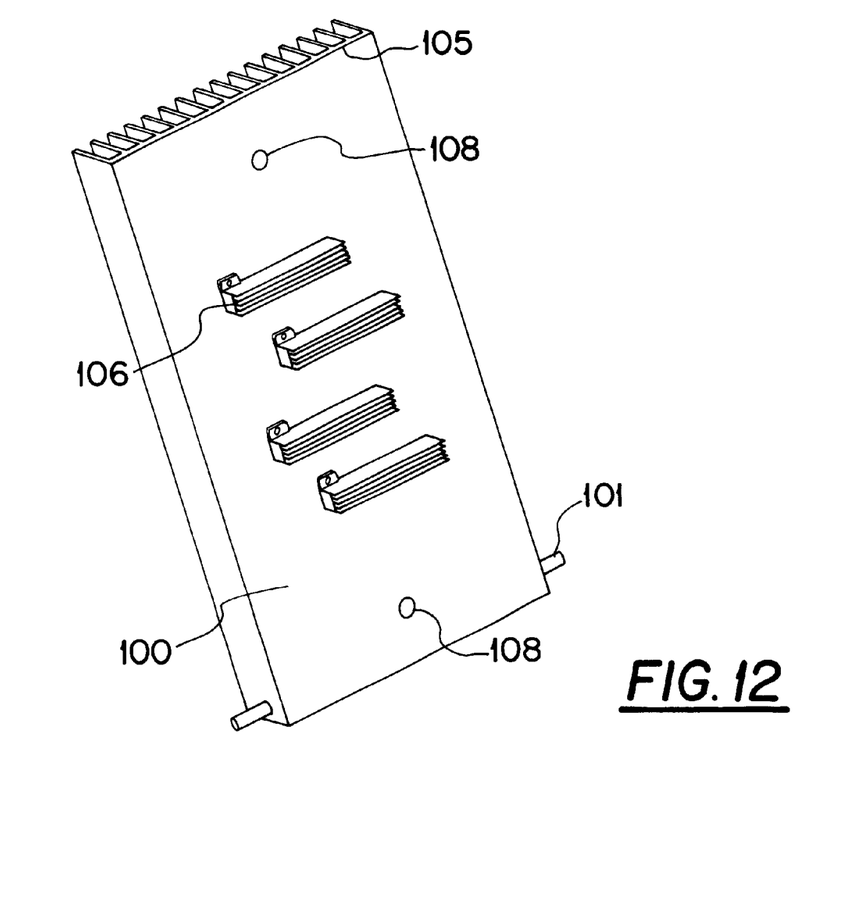
FIG. 12 is a perspective of the cooling system shown in FIG. 11 showing a series of power resistors conductively connected thereto.

FIGS. 11 and 12 show a test embodiment of a heat exchanger at 100 and ejector assembly 101, as tested. The ejector assembly 101 includes a series of fifteen laterally spaced ejectors 102. As shown, the heat exchanger 100 includes sixteen fins 104, extending upwardly from a body portion 105 of the heat exchanger 100. The fins 104 extend the length of the heat exchanger 100 and are laterally spaced from each other along the width of the body portion 105. There is approximately 13 mm between adjacent fins 104, forming fifteen channels ($c_1$ to $c_{15}$), each having a width of approximately 13 mm, across the width of the heat exchanger 100. Each channel $c_1$ to $c_{15}$ has a cross-sectional area of approximately 2.4 $cm^2$, providing a total flow area of approximately 36 $cm^2$.

As further shown, four power resistors 106 are attached to an opposite side of the body portion 105. The power resistors 106 allow the amount of heat input to the heat exchanger 100 to be predetermined and controlled. A pair of thermocouples 108 measure a temperature gradient of the heat exchanger 100 between one end (proximate the ejector assembly) and an opposite end (opposite the ejector assembly 101) thereof.

The test were conducted under 3 bar and 3.5 bar (gauge) pressures feeding the ejector assembly 101. The heat load from the power resistors 106 was 147 watts. The ambient temperature was 26° C. and varied ±1° C. during the test period.

Figure 13:
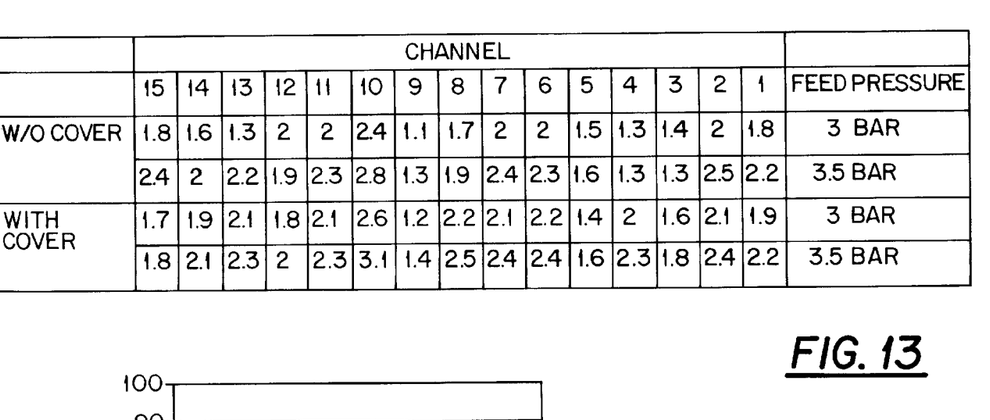
FIG. 13 is a chart showing measured air flow velocities for heat exchanger channels with and without a cover on the heat exchanger.

FIG. 13 shows the measured air velocities within the channels ($c_1$–$c_{15}$) of the heat exchanger 100 with a cover (similar to the embodiment illustrated in FIG. 7A) and without a cover (similar to the embodiment illustrated in FIG. 2). The average air velocity was approximately 2.17 m/sec. The average temperature difference between the thermocouples 108 was approximately 12.6° C. The amplification ratio between the volumetric flow rate of the air through the channels ($c_1$–$c_{15}$) and the air exiting the ejectors 102 was found to be $\epsilon=30.5$; meaning the volume flow rate of air through the channels was 30.5 times the volume flow rate of air through the ejectors. Furthermore, the convection factor of the heat exchanger 100, as tested with the ejector assembly 101, was approximately 38 W/($m^2$ °C.), compared with approximately 5.5 W/($m^2$ °C.) for natural convection.

Figure 14:
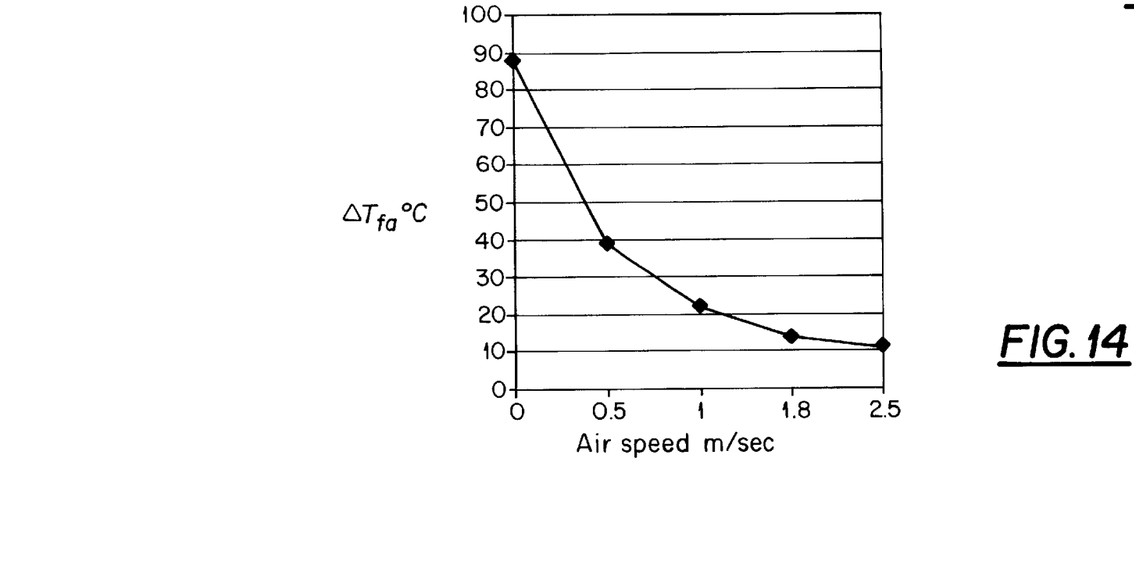
FIG. 14 is a graph showing the computed relation between the mean temperature difference and the velocity of air flow through the heat exchanger channels.

FIG. 14 shows a computed model of the relation between the air speed (in m/sec) of the air flowing through the channels of the heat exchanger and the average temperature difference (in degrees Celsius) between the temperature of the fins of the heat exchanger and the temperature of the ambient air. As shown, for natural convection (air speed equal to approximately 0 m/sec), the mean temperature difference is approximately 88° C., while for an air speed of approximately 2.5 m/sec, the mean temperature difference is approximately 11° C.; meaning heat is more rapidly liberated from the heat exchanger under forced convection. As stated previously, the average air velocity as tested was approximately 2.17 m/sec. From the computed model described above, this velocity corresponds to a mean temperature difference of approximately 13° C. The measured mean temperature difference of the cooling system, as tested, was approximately 14° C., which closely correlates to the computed model. As such, it is shown that the computed efficiency of the cooling system is possible with the present invention.

While the invention has been described with reference to the certain illustrated embodiments, the words which have been used herein are words of description, rather than words or limitation. Changes may be made, within the purview of the appended claims, without departing from the scope and spirit of the invention in its aspects. Although the invention has been described herein with reference to particular structures, acts, and materials, the invention is not to be limited to the particulars disclosed, but rather extends to all equivalent structures, acts, and materials, such as are within the scope of the appended claims.

What is claimed is:

1. A cooling system comprising:
an apparatus having two spaced, longitudinally extending walls protruding from an outwardly facing surface, each of said walls having a first end and a second end, said walls and said surface forming a longitudinal cavity extending between said first and second ends of said walls; and
a nozzle coupled to said apparatus and positioned within said cavity and between said walls such that a gap exists between said nozzle and each of said walls, said nozzle having an exit opening facing toward a far end of said cavity adjacent said second ends of said walls to direct fluid passing through said nozzle along said cavity toward said far end.

2. The cooling system of claim 1, wherein
each of said longitudinally extending walls are heat-exchanging fins that are substantially parallel to each other.

3. A system according to claim 1, wherein
said apparatus is a heat exchanger.

4. A system according to claim 3, wherein
said nozzle is coupled directly to said heat exchanger.

5. A system according to claim 3, further comprising:
a manifold structure coupled to said heat exchanger, and said nozzle coupled directly to said manifold structure.

6. A system according to claim 1, further comprising:
a fluid compressor coupled to said nozzle to supply fluid to said cavity, through said nozzle.

7. A system according to claim 1, wherein
said apparatus is coupled to an antenna.

8. A system according to claim 7, wherein
said antenna, said apparatus, and said nozzle are coupled together to a top of a structure elevated relative to the ground.

9. A system according to claim 8, wherein
said structure is a pole.

10. A system for cooling telecommunications electronic equipment comprising:
a heat exchanger including a heat exchanger body and a plurality of elongated fins protruding outwardly from said heat exchanger, each of said plurality of fins being substantially parallel and in spaced relation to each other, and a plurality of longitudinally extending channels formed between each pair of adjacent fins and extending the length of said adjacent fins;

a plurality of nozzles, each of said plurality of nozzles positioned within a channel;

a compressor generating pressurized air;

a conduit fluidly coupled to and extending between said plurality of nozzles and said compressor to deliver pressurized air, each of said plurality of nozzles positioned to eject said pressurized air and ambient air adjacent said plurality of nozzles along and through said channels, respectively, to dissipate heat from said fins.

* * * * *